(12) United States Patent
Lee et al.

(10) Patent No.: US 8,633,066 B2
(45) Date of Patent: Jan. 21, 2014

(54) THIN FILM TRANSISTOR WITH REDUCED EDGE SLOPE ANGLE, ARRAY SUBSTRATE AND HAVING THE THIN FILM TRANSISTOR AND MANUFACTURING METHOD THEREOF

(75) Inventors: Byung Chun Lee, Beijing (CN); Tai Sung Choi, Beijing (CN); Shuibin Ni, Beijing (CN); Pil Seok Kim, Beijing (CN)

(73) Assignees: Boe Technology Group Co., Ltd., Beijing (CN); Chengdu Boe Optoelectronics Technology Co., Ltd., Chengdu, Sichuan Province (CN)

(*) Notice: Subject to any disclaimer, the term of this patent is extended or adjusted under 35 U.S.C. 154(b) by 40 days.

(21) Appl. No.: 13/270,423

(22) Filed: Oct. 11, 2011

(65) Prior Publication Data

US 2012/0086013 A1    Apr. 12, 2012

(30) Foreign Application Priority Data

Oct. 12, 2010    (CN) .......................... 2010 1 0512054

(51) Int. Cl.
*H01L 21/00*    (2006.01)

(52) U.S. Cl.
USPC .................................. 438/151; 257/E29.273

(58) Field of Classification Search
USPC ............... 257/72, 347, E29.273; 438/151, 34
See application file for complete search history.

(56) References Cited

U.S. PATENT DOCUMENTS

| | | | |
|---|---|---|---|
| 5,384,271 A * | 1/1995 | Kwasnick et al. | 438/158 |
| 2007/0082435 A1* | 4/2007 | Lai et al. | 438/149 |
| 2007/0181877 A1 | 8/2007 | Lim et al. | |
| 2007/0267662 A1 | 11/2007 | Lin | |
| 2008/0303024 A1* | 12/2008 | Song et al. | 257/59 |
| 2010/0075450 A1* | 3/2010 | Choi et al. | 438/30 |

FOREIGN PATENT DOCUMENTS

| | | |
|---|---|---|
| CN | 101013705 A | 8/2007 |
| TW | 200425254 | 11/2004 |

OTHER PUBLICATIONS

First Chinese Office Action dated Jul. 4, 2012; Appln. No. 201110020244.2.
Second Chinese Office Action dated Jan. 16, 2013; Appln. No. 201110020244.2.
Third Chinese office Action dated Jul. 8, 2013; Appln. No. 201110020244.2.

* cited by examiner

*Primary Examiner* — Kimberly Rizkallah
*Assistant Examiner* — Duy T Nguyen
(74) *Attorney, Agent, or Firm* — Ladas & Parry LLP

(57) ABSTRACT

A thin film transistor is provided, which comprises at least an active layer, a source electrode and a drain electrode, wherein the source electrode and the drain electrode are located on the active layer and spaced apart from each other; a channel is defined in the active layer between the source electrode and the drain electrode; edges of the active layer are aligned with outer edges of the source electrode and the drain electrode, the outer edge of the source electrode is an edge of the source electrode opposite to the drain electrode, and the outer edge of the drain electrode is an edge of the drain electrode opposite to the source electrode. Also, a method of manufacturing a thin film transistor is provided.

11 Claims, 5 Drawing Sheets

24  7   6   8  24 11

THIN FILM TRANSISTOR WITH REDUCED EDGE SLOPE ANGLE, ARRAY SUBSTRATE AND HAVING THE THIN FILM TRANSISTOR AND MANUFACTURING METHOD THEREOF

The present invention claims the priority of CN201010512054.8 filed on Oct.12, 2010.

BACKGROUND

Embodiments of the disclosed technology relate to a thin film transistor, an array substrate and a manufacturing method thereof.

At present, liquid crystal displays are commonly used flat panel displays, and thin film transistor liquid crystal displays (TFT-LCDs) are the mainstream products of the liquid crystal displays. In recent years, high aperture ratio fringe field switch (HFFS) type LCD is one of the focused development directions to achieve wide view angle display effect.

A liquid crystal panel of an HFFS type LCD is formed by bonding an array substrate and a color filter substrate. The array substrate comprises a base substrate on which a plurality of data lines and a plurality of gate lines intercrossing with each other are formed to define a plurality of pixel units arranged in matrix. Each of the pixel units comprises a TFT switch, a pixel electrode and a common electrode, and a fringe electrical field for driving the rotation of the liquid crystal is formed between the pixel electrode and the common electrode. The TFT switch comprises a gate electrode, a source electrode, a drain electrode and an active layer with the gate electrode connected with a corresponding gate line, the source electrode connected with a corresponding data line, the drain electrode connected with the pixel electrode, and the active layer being formed between the source/drain electrodes and the gate electrode. A typical laminate structure of the various conductive patterns on the HFFS type array substrate is as follows: a gate insulating layer is formed on the gate electrode and the gate line; the data line, the source electrode, the drain electrode, the active layer and the pixel electrode are formed on the gate insulating layer; a passivation layer is formed on the pixel electrode, and the common electrode is formed on the passivation layer.

The patterns of the data line, the source electrode and the drain electrode are generally formed by a single-mask patterning process with a double-tone mask when array substrates of other types (such as twisted nematic type, TN type) are fabricated. However, if the above patterning process is used in manufacturing the HFFS type array substrate, problems occur due to the following reasons. FIGS. 1A-1E show a specific procedure for manufacturing an HFFS type array substrate with a five-mask patterning process. At first, an active layer film 21 and a source/drain metal film 22 are deposited sequentially on a gate insulating layer 4, and the active layer film 21 generally comprises a semiconductor film 23 and a doped semiconductor film 24 from the bottom to the top. Thereafter, a photoresist layer 25 is applied, and then is exposed with a double-tone mask and developed to form a photoresist pattern with a photoresist-completely-remained region, a photoresist-partially-remained region and a photoresist-completely-removed region. A first etching is performed on a portion corresponding to the photoresist-completely-remained region. Specifically, the source/drain metal film 22 corresponding to the photoresist-completely-removed region is removed, as shown in FIG. 1A; and the semiconductor film 23 and the doped semiconductor film 24 corresponding to the photoresist-completely-remained region is removed, as shown in FIG. 1B; thus, a data line, a source electrode and a drain electrode are formed. The data line, the source electrode and the drain electrode are etched according to their respective desired line width. The photoresist layer 25 is then thinned by an amount corresponding to the thickness of the photoresist-partially-remained region, as shown in FIG. 1C, and the photoresist layer 25 in the photoresist-partially-remained region is removed completely. Then the source/drain metal film 22 corresponding to the photoresist-partially-remained region is etched by a dry etch method, as shown in FIG. 1D; and the doped semiconductor film 24 in the active layer film 21 is etched by a dry etch method so as to form the active layer with a defined channel, as shown in FIG. 1E. Finally, the remained portion of the photoresist layer 25 is removed so as to continue the subsequent processes. The above mentioned etching on the source electrode, the drain electrode and the active layer film may be controlled with the etching time to ensure the etching thickness of the films, so as to reach the predetermined etching positions consistent with the photoresist pattern.

In the above solutions, after the data line, the source electrode 7, and the drain electrode 8 are formed, as shown in FIG. 2, the slope angle of the edges of the source electrode 7 and the drain electrode 8 is relatively large; further, some residual doped semiconductor layer film 24 (n+ fence) exists at the periphery of the source electrode 7 and the drain electrode 8. Therefore, if a pixel electrode 11 is formed thereon later, as shown in FIG. 2, several corners are formed at the locations for lap-jointing between the pixel electrode 11 and the drain electrode 8. Furthermore, if the thicknesses of the source/drain metal film, the semiconductor film and the doped semiconductor film are larger than the thickness of the transparent conductive film used for the pixel electrode 11, cracks are likely to occur in the pixel electrode 11 at the corners, which can lead to defective displaying.

The above structural defect is not limited to the HFFS type array substrate, and the defects may also exist in the structure in which a relatively thin transparent electrode is directly lap-jointed on the drain electrode. In order to overcome the above defects, a conventional resolution is to form the pixel electrode between the active layer and the data line, the source electrode and the drain electrode. That is to say, the active layer, the pixel electrode, and the data line, the source electrode and the drain electrode are formed with three patterning processes, respectively, which obviously increases the times of the patterning processes. For example, the HFFS type array substrate is generally fabricated with a six-mask process (6Mask).

SUMMARY

An embodiment of the disclosed technology provides a manufacturing method for a thin film transistor, comprising at least a process of forming an active layer, a source electrode and a drain electrode, wherein the process of forming the active layer, the source electrode and the drain electrode comprises: forming sequentially an active layer film and a source/drain metal film; applying a layer of photoresist on the source/drain metal film; exposing and developing the photoresist by using a double-tone mask so as to form a photoresist pattern including a photoresist-completely-remained region, a photoresist-partially-remained region, and a photoresist-completely-removed region; performing a first wet etch in which the source/drain metal film corresponding to the photoresist-completely-removed region is over-etched so that edges of the source/drain metal film are recessed inside edges of the photoresist pattern; performing a first dry etch in which the active layer film exposed by the photoresist is etched; thinning the photoresist by a thickness corresponding to the thickness of the photoresist-partially-remained region through an ashing process, so as to remove the photoresist in the photoresist-partially-remained region; performing a second dry etch in which the source/drain metal film corresponding to the photoresist-partially-remained region is etched; performing a third dry etch in which a part of the active layer film corresponding to the photoresist-partially-remained region is etched; and removing the remained photoresist.

Another embodiment of the disclosed technology provides a thin film transistor, comprising at least an active layer, a source electrode and a drain electrode, wherein the source electrode and the drain electrode are located on the active layer and spaced apart from each other; a channel is defined in the active layer between the source electrode and the drain electrode; edges of the active layer are aligned with outer edges of the source electrode and the drain electrode, the outer edge of the source electrode is an edge of the source electrode opposite to the drain electrode, and the outer edge of the drain electrode is an edge of the drain electrode opposite to the source electrode.

Another embodiment of the disclosed technology provides a manufacturing method for an array substrate, wherein the array substrate comprise a base substrate and a thin film transistor formed on the base substrate, and the thin film transistor is formed by the manufacturing method for the thin film transistor according to the above embodiment.

Still another embodiment of the disclosed technology provides an array substrate, comprising a base substrate, a data line and a thin film transistor formed on the base substrate, the thin film transistor including an active layer, a source electrode and a drain electrode, wherein the source electrode and the drain electrode are located on the active layer and spaced apart from each other; a channel is defined in the active layer between the source electrode and the drain electrode; edges of the active layer are aligned with outer edges of the source electrode and the drain electrode, the outer edge of the source electrode is an edge of the source electrode opposite to the drain electrode, and the outer edge of the drain electrode is an edge of the drain electrode opposite to the source electrode.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Figure 1A:
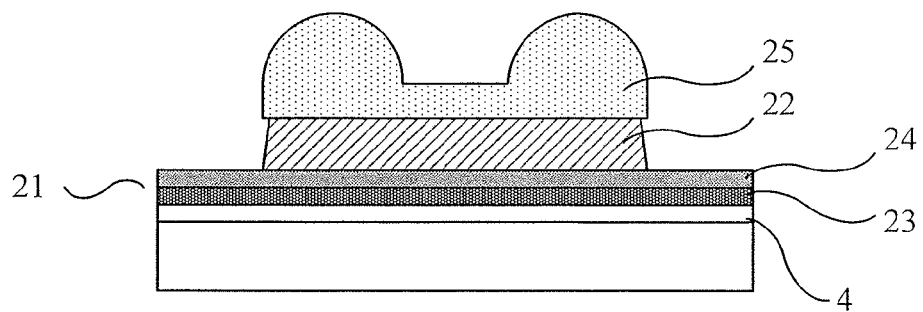
FIGS. 1A-1E are structure diagrams of an HFFS type array substrate manufactured by a conventional five-mask patterning process.
Figure 1B:
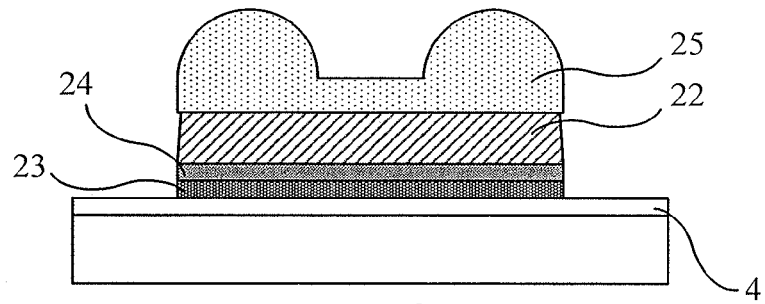
Figure 1C:
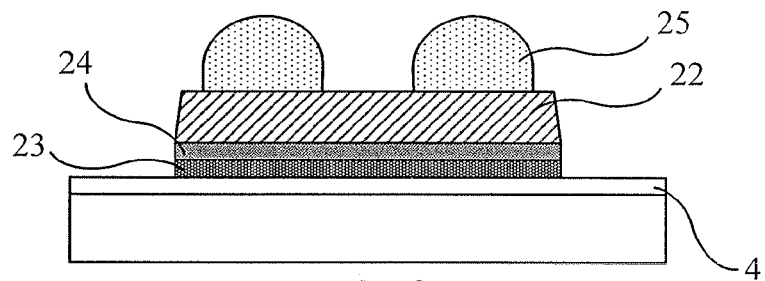
Figure 1D:
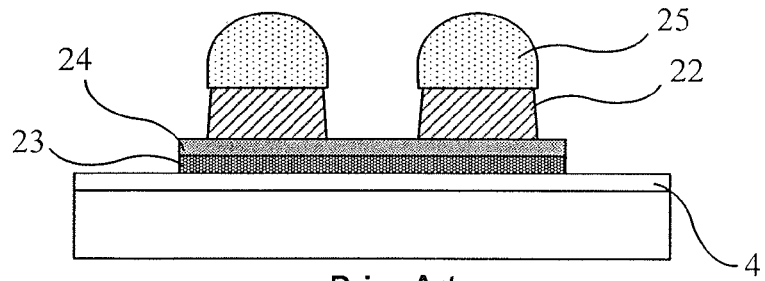
Figure 1E:
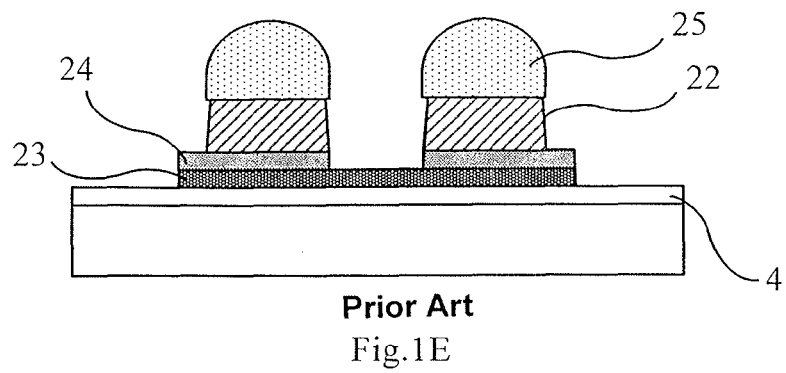
Figure 2:
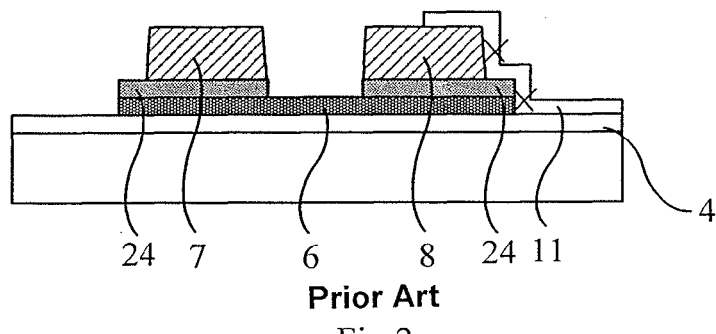
FIG. 2 is a structure diagram of defects occurring in the HFFS type array substrate manufactured by the conventional five-mask patterning process

The disclosed technology now will be described more clearly and fully hereinafter with reference to the accompanying drawings, in which the embodiments of the disclosed technology are shown. Apparently, only some embodiments of the disclosed technology, but not all of embodiments, are set forth here, and the disclosed technology may be embodied in other forms. All of other embodiments made by those skilled in the art based on embodiments disclosed herein without mental work fall within the scope of the disclosed technology.

First Embodiment

The first embodiment of the disclosed technology provides a manufacturing method of a thin film transistor. The manufacturing method according to the embodiment comprises at least a process for forming an active layer, a source electrode and a drain electrode. Specifically, the process for forming an active layer, a source electrode and a drain electrode comprises the following steps.

Step 310, forming an active layer film 21 and a source/drain metal film 22. An example of the active layer film 21 comprises a semiconductor film 23 and a doped semiconductor film 24 formed sequentially, and the source/drain metal film 22 may be made of Molybdenum (Mo), Aluminum (Al) and the like. If the thin film transistor is formed on an array substrate, the step is generally performed on a gate insulating film 4.

Step 320, applying a layer of photoresist 25 on the source/drain metal film 22.

Step 330, exposing and developing the photoresist 25 by using a double-tone mask, such as a half-tone mask or a gray tone mask, so as to form a photoresist-completely-remained region, a photoresist-partially-remained region, and a photoresist-completely-removed region. The thickness of the photoresist-partially-remained region is less than that of the photoresist-completely-remained region, and the photoresist-partially-remained region corresponds to the position for forming a channel in the active layer.

Thereafter, several steps of etching are performed, wherein an S/D etch and multiple dry etches are required, which will be described hereinafter.

Figure 3A:
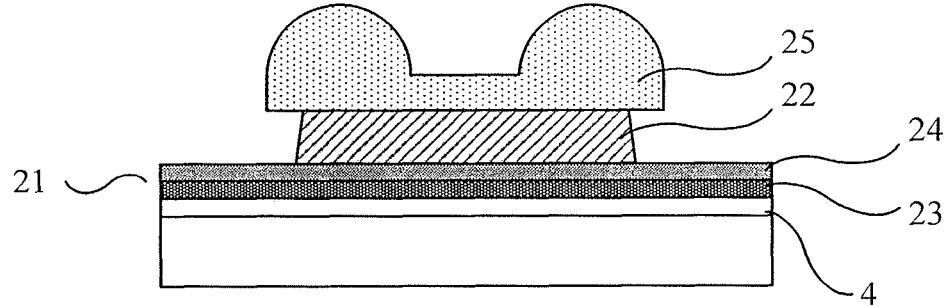
FIGS. 3A-3E are structure diagrams for the process manufacturing a source electrode, a drain electrode and an active layer of a thin film transistor according to a first embodiment of the disclosed technology.

Step 340, performing a first wet etch in which the source/drain metal film 22 corresponding to the photoresist-completely-removed region is etched, and further is over-etched so that the edges (or sides) of the source/drain metal film 22 are recessed inside the edges (sides) of the pattern of the photoresist 25, i.e., inside the edges of the pattern of the photoresist 25 in the photoresist-completely-remained region, by controlling the etching time, as shown in FIG. 3A.

The recess amount may be adjusted by controlling the etching time. Preferably, the etching time for the first wet etch is 130%-300% of the time by which the source/drain metal film 22 corresponding to the photoresist-completely-removed region is removed completely. The time by which the source/drain metal film 22 corresponding to the photoresist-completely-removed region is removed completely may be called as an end point detection (EPD) time, i.e., the time by which the source/drain metal film 22 in an area corresponding to the photoresist-completely-removed region is just etched completely. The time is a value which can be determined according to the factors such as the properties, the thickness, the area of the material to be etched, the performance of the etching agent and the like, and on the basis of which the time for the first dry etch can be obtained after adjustment. The etching time for the first wet etch according to the present embodiment is for example 130%-300% of the EPD time.

Step 350, performing a first dry etch in which the active layer film 21 exposed by the photoresist is etched.

Figure 3B:
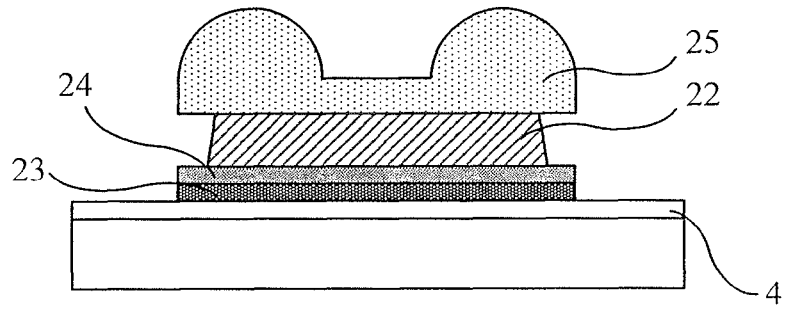

Because the edges of the source/drain metal film 22 are recessed inside the edges of the pattern of the photoresist 25, the dry etch on the active layer film actually corresponds to the portion which is not covered by and exposed by the photoresist 25, as shown in FIG. 3B.

Figure 3C:
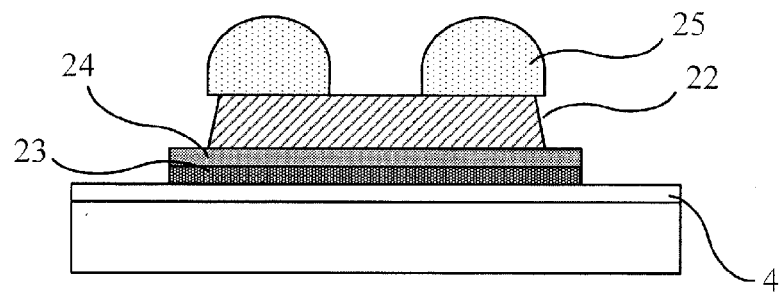

Step 360, thinning the photoresist 25 by a thickness corresponding to the thickness of the photoresist-partially-remained region through an ashing process, so as to remove the photoresist in the photoresist-partially-remained region, as shown in FIG. 3C.

After the ashing step, the photoresist 25 in the photoresist-partially-remained region is removed completely, and the photoresist 25 in the photoresist-completely-remained region is left with a certain thickness. The ashing process on the photoresist 25 may be considered as a dry etch in which the material of the photoresist 25 is etched by using a proper etching agent. The etch is to thin the photoresist 25 from the surface of the photoresist 25 in a direction perpendicular to the surface. Except that the thickness is reduced, the sides on the edges of the photoresist 25 can also be etched to some extent, which leads to the decrease of the pattern size of the photoresist 25. Because the edges of the source/drain metal film 22 are recessed inside of the pattern edges of the photoresist 25 and the recess amount can be controlled by controlling the etching time in Step 340, the outer edges of the photoresist in the photoresist-completely-remained region are aligned with or close to the edges of the under source/drain metal film 22 after the first ashing on the photoresist 25. The outer edges of the photoresist are the edges opposite to the channel region. That is to say, in Step 340, preferably, the edges of the source/drain metal film are over etched and recessed inside the edges of the pattern of the photoresist in such a manner that the edges of the source/drain metal film are covered within the pattern of the photoresist after the photoresist is thinned by a thickness corresponding to the thickness of the photoresist-partially-remained region through the ashing step.

Figure 3D:
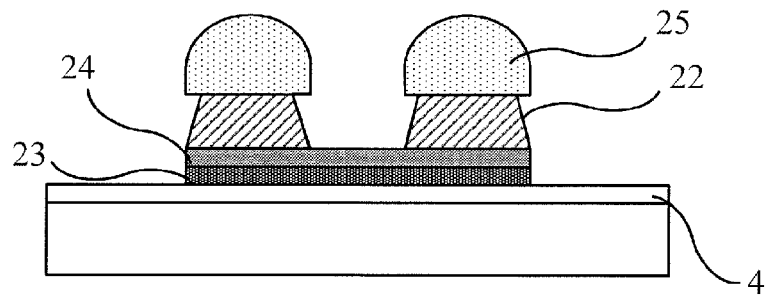

Step 370, performing a second dry etch in which the source/drain metal film 22 corresponding to the photoresist-partially-remained region is etched, as shown in FIG. 3D.

In the step, the source/drain metal film 22 can be etched through a dry etch process. Different from the conventional method, no additional source/drain metal film 22 exists beyond the photoresist-completely-remained region except the source/drain metal film 22 corresponding to the photoresist-partially-remained region which is not covered by the photoresist 25 and needs to be etched because the edges of the photoresist-completely-remained region are subsequently aligned with the outer edges of the under source/drain metal film 22, as shown in FIG. 4C. Therefore, the etching time for the second dry etch is reduced compared with the corresponding dry etching time in the conventional method. Preferably, the etching time for the second dry etch is 110%-300% of the time by which the source/drain metal film 22 corresponding to the photoresist-partially-remained region can be just etched completely. In Step 370, the etching agent used to etch the source/drain metal film 22 can simultaneously etch the doped semiconductor film 24 and the semiconductor film 23 exposed outside the source/drain metal film 22, but the doped semiconductor film 24 at the channel position is covered by the source/drain metal film 22, and is exposed after the source/drain metal film 22 is removed in etching. The doped semiconductor film 24 and the semiconductor film 23 exposed outside the source/drain metal film 22 can be etched by controlling the etching time.

Figure 3E:
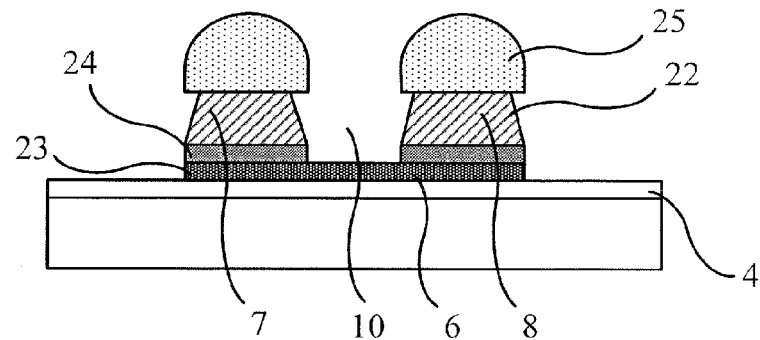

Step 380, performing a third dry etch in which the part of the active layer film 21 corresponding to the photoresist-partially-remained region is etched away. Specifically, the doped semiconductor film 24 in the active layer film 21 is etched so as to form the active layer 6 including a channel 10 and patterns of the source electrode 6 and the drain electrode 8, as shown in FIG. 3E.

In the step, the doped semiconductor film 24 is etched. If the active layer film is a film of a single layer material, then a part of the active layer film can be etched in the thickness direction by controlling the etching time. Because the edges of the doped semiconductor film 24 are aligned with the edges of the source/drain metal film 22 after the second dry etch, similarly, almost none of the doped semiconductor layer 24 is beyond the scope of the photoresist-completely-remained region except the portion corresponding to the photoresist-partially-remained region, and the time for the third dry etch can be reduced.

Step 390, removing the remained photoresist 25.

The above example is a process manufacturing the active layer, the source electrode and the drain electrode with a double-tone mask. In the solution, the time periods for the first etch performed on the source/drain metal film, ashing on the photoresist in the photoresist-partially-remained region and the second dry etch on the source/drain electrode corresponding to the photoresist-partially-remained region can be effectively controlled to form an etched pattern recessed inside the photoresist pattern. Thus, in combination with the reduced area of the photoresist after the ashing step, the step shape of the etched pattern between the photoresist-completely-remained region and the photoresist-partially-remained region can be avoided, and the accuracy of the etch on the pattern can be increased.

The above solution can not only reduce the corners through the over etch on the source/drain metal film, but can also decrease the slope angle compared with the conventional process, which is caused by the following reasons.

In the conventional process, after the first ashing on the photoresist, other than the channel region, there is still some source/drain metal film exposed outside the photoresist-completely-remained region. When the source/drain metal film is dry etched, the etch on the portion exposed outside the photoresist is mainly physical etching, and the etch is mainly performed along the vertical direction with a relatively large slope angle. In addition, some residual active layer film is remained under the source/drain metal film, i.e., the generally appeared residual doped semiconductor film (n+fence) phenomenon, which forms a height difference with the films under the active layer film.

In the solution according to the embodiment, because the source/drain metal film is covered within the photoresist-completely-remained region and inside the photoresist pattern, the etch at the edges is mainly chemical etching, and the etch is mainly performed along the horizontal direction with a relatively small etching velocity and relatively small slope angle. Preferably, the edge of the source/drain metal film is formed with a slope angle of 30°-75° by controlling the etching time. By controlling the etching time, the active layer film below the source/drain metal film may not be exposed so as to eliminate the residual doped semiconductor film phenomenon.

The manufacturing method of the thin film transistor is suitable to be applied in manufacturing an array substrate. In practice, the pixel electrode is typically made of indium tin oxide (ITO), and the material is relatively brittle and has relatively small thickness (normally, 400 Å-800 Å). Compared with the semiconductor film with a thickness of about 1800 Å, the doped semiconductor film with a thickness of about 500 Å and the source/drain metal film with a thickness of about 2200 Å, the thickness of the pixel electrode is relatively small and is likely be cracked at the corners of the thick film pattern. When the solution according to the embodiment is applied to manufacture the HFFS type array substrate, the corners and slope angle of the active layer, the data line, the source electrode and the drain electrode can be reduced, so that the pixel electrode formed thereon is not likely to be cracked at the corners.

According to the solution of the present embodiment, by controlling the etching time, the slope angle of the source/drain metal film can be reduced, and the residual doped semiconductor film phenomenon can also be reduced, which solves the problem that the relatively thin pixel electrode pattern can not be deposited on the patterns of the active layer and the source/drain electrodes manufactured by a double-tone mask, and is contributed to simplify the manufacturing process of the thin film transistor and the corresponding HFFS type array substrate.

The embodiment of the disclosed technology also provides a thin film transistor, comprising at least an active layer, a source electrode and a drain electrode. The source electrode and the drain electrode are located on the active layer and spaced apart from each other; a channel is defined in the active layer between the source electrode and the drain electrode; the edges of the active layer are aligned with the outer edges of the source electrode and the drain electrode, the outer edge of the source electrode is an edge of the source electrode opposite to the drain electrode, and the outer edge of the drain electrode is an edge of the drain electrode opposite to the source electrode. Preferably, the slope angle of the edges of the source electrode and the drain electrode is in the range of 30°-75°. The thin film transistor can be manufactured by the thin film transistor manufacturing method provided in any embodiment according to the disclosed technology, and the detailed structure is shown in FIG. 4.

The embodiment of the disclosed technology also provides a manufacturing method for an array substrate, which uses the manufacturing method for the thin film transistor provided in any embodiment according to the disclosed technology to form patterns of an active layer, a source electrode and a drain electrode on the array substrate. The manufacturing method for the thin film transistor according to the embodiment of the disclosed technology can be applied in manufacturing various types of array substrates. A typical array substrate structure comprises a gate line, a gate electrode, a data line, an active layer, a source electrode, a drain electrode and a pixel electrode. A horizontal field type array substrate may further comprise a common electrode. Preferably, the manufacturing method for the thin film transistor is applied in manufacturing an HFFS type array substrate, which will be described in detail hereinafter.

Second Embodiment

The second embodiment of the disclosed technology provides a manufacturing method for an array substrate, specifically, a process manufacturing an HFFS type array substrate.

Figure 4A:
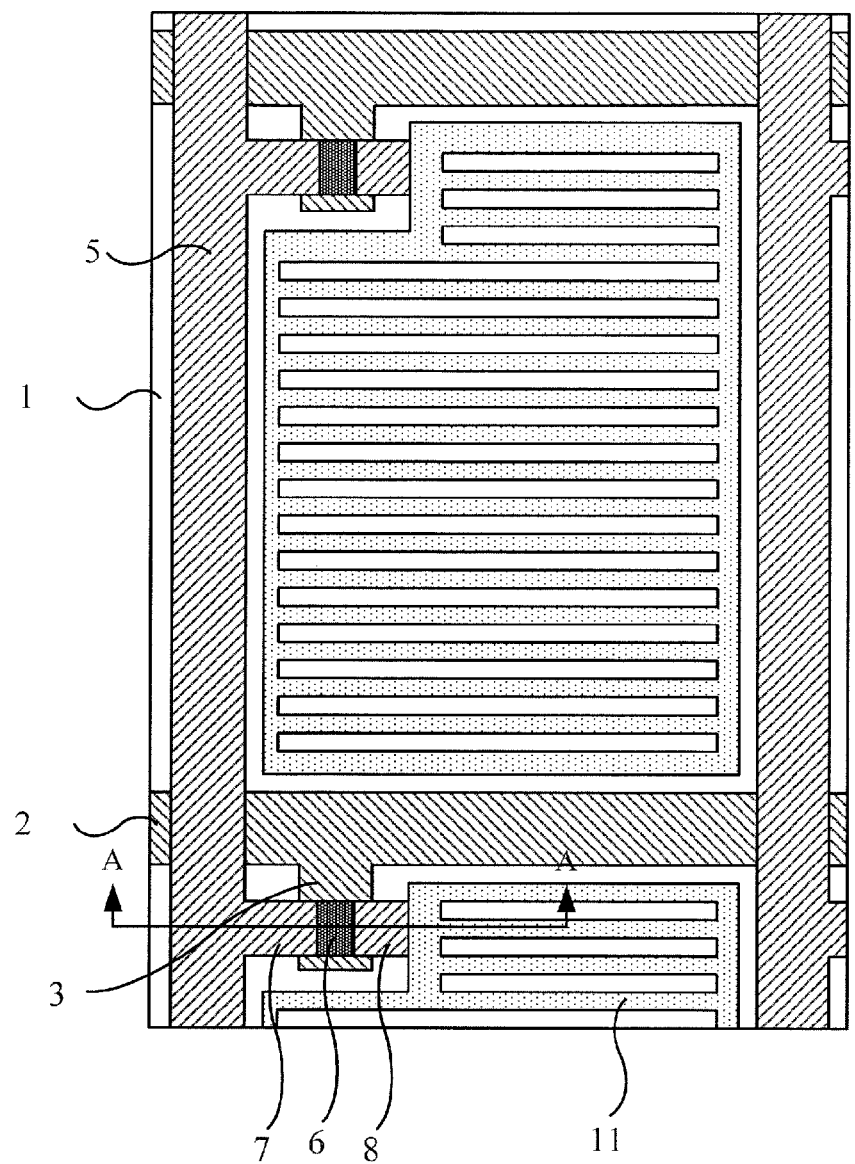
FIG. 4A is a partial top view of the array substrate manufactured according to the second embodiment of the disclosed technology.
Figure 4B:
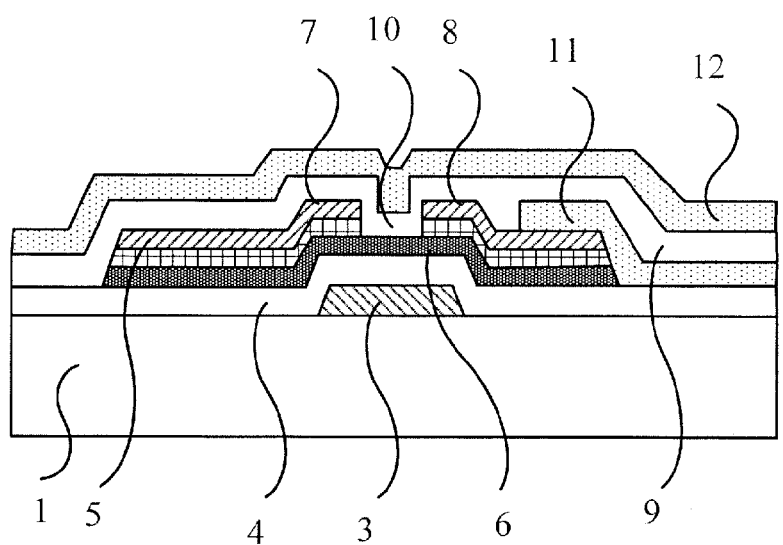
FIG. 4B is a sectional view of the structure shown in FIG. 4A taken along line A-A.

FIG. 4A is a partial top view of the array substrate manufactured according to the second embodiment of the disclosed technology; FIG. 4B is a sectional view of the structure shown in FIG. 4A taken along line A-A.

The array substrate according to the embodiment comprises a gate line, a gate electrode, a data line, an active layer, a source electrode, a drain electrode, a pixel electrode and a common electrode. The process for forming the gate line, the gate electrode, the data line, the active layer, the source electrode, the drain electrode, the pixel electrode and the common electrode comprises the following steps.

Step 510, forming a gate line 2 and a gate electrode 3 on a base substrate 1 by a patterning process.

Step 520, forming a gate insulating layer 4 on the base substrate 1 after Step 510.

Step 530, forming a data line 5, an active layer 6, a source electrode 7, and a drain electrode 8 on the gate insulating layer 4. This step may use the solution as described in the first embodiment, and the data line 5 is formed simultaneously with the source electrode 7 and the drain electrode 8.

Step 540, forming a pixel electrode 11 on the above patterns on the base substrate 1 by a patterning process. Preferably, the thickness of the pixel electrode 11 may be in the range of 20 nm-200 nm.

Step 550, forming a passivation layer 9 on the base substrate 1 after Step 550. Generally, a via hole in an interfacing region may be formed in the passivation layer 9 through a patterning process.

Step 560, forming a pattern of a common electrode on the passivation layer 9 through a patterning process, and the patterns of the insulating layer and the common electrode 12 are not shown in the top view.

In the embodiment, the HFFS type array substrate can be manufactured by adopting the solution according to the first embodiment to form the thin film transistor on the array substrate, and it can be manufactured with a five-mask patterning process, which simplifies the manufacturing process and reduces the product cost. In practice, the manufacturing process for the gate line, the gate electrode, the pixel electrode and the common electrode is not limited to the above solutions and can also be manufactured with other methods.

The embodiment of the disclosed technology also provides an array substrate, comprising a base substrate, a data line and a thin film transistor formed on the base substrate, the thin film transistor including an active layer, a source electrode and a drain electrode, wherein the source electrode and the drain electrode are located on the active layer and spaced apart from each other; a channel is defined in the active layer between the source electrode and the drain electrode; the edges of the active layer are aligned with the outer edges of the source electrode and the drain electrode, the outer edge of the source electrode is an edge of the source electrode opposite to the drain electrode, and the outer edge of the drain electrode is an edge of the drain electrode opposite to the source electrode.

As for a typical array substrate structure, it further comprises a pixel electrode on the base substrate, the pixel electrode, the data line and the active layer, the source electrode and the drain electrode are formed on the same insulating layer, and the pixel electrode is lap-jointed on the drain electrode.

The array substrate may be further formed with a gate line, a gate electrode and a common electrode, the gate line and the gate electrode are formed on the base substrate and are covered below the gate insulating layer. The pixel electrode, the data line, the active layer, the source electrode and the drain electrode are formed on the gate insulating layer and covered below the passivation layer, and the common electrode is formed on the passivation layer.

Specifically, as shown in FIGS. 4A and 4B, the array substrate is an HFFS type substrate, comprising a base substrate 1, a gate line 2, a gate electrode 3, a data line 5, an active layer 6, a source electrode 7, a drain electrode 8, a pixel electrode 11 and a common electrode 12 on the base substrate 1. The active layer film used to manufacturing the active layer 6 is remained below the data line 5, the source electrode 7 and the drain electrode 8. The active layer 6 is formed below the source electrode 7 and the drain electrode 8, and has outer edges aligned with the outer edge of the patterns of the source electrode 7 and the drain electrode 8. A channel 10 on the active layer 6 is formed between the source electrode 7 and the drain electrode 8. The pixel electrode 11, the data line 5, the active layer 6, the source electrode 7 and the drain electrode 8 are formed on the same insulating layer, and the pixel electrode 11 is lap-jointed on the drain electrode 8.

The array substrate according to the embodiment may be manufactured with the manufacturing method for the array substrate according to the embodiment of the disclosed technology to form the corresponding patterns. The steps are simplified and the corners at the edges of the data line, the source electrode, the drain electrode and the active layer can be reduced, the slope angle can be decreased, and the contour can be improved, so that the pixel electrode can be directly lap-jointed on the drain electrode and is not likely to be cracked.

The array substrate according to the embodiment is a typical HFFS type array substrate, the gate line 2 and the gate electrode 3 are formed on the base substrate and are covered below the gate insulating layer 4. The pixel electrode 11, the data line 5, the active layer 6, the source electrode 7 and the drain electrode 8 are formed on the gate insulating layer 4 and are covered below the passivation layer 9. The common electrode is formed on the passivation layer 9. However, the positions of the gate line 2, the gate electrode 3 and the common electrode 12 may not be limited to this in practice.

As for the array substrate according to the embodiment, the edges of the data line, the source electrode and the drain electrode may be formed with a slope angle of 30°-75° by controlling the etching time, and the residual active layer film phenomenon can be eliminated, so that the relatively thin pixel electrode can be lap-jointed on the drain electrode directly. Preferably, the thickness of the pixel electrode may be in the range of 20 nm-200 nm.

The above embodiments are mainly described with an HFFS type array substrate as an example, but the array substrate of the disclosed technology may be of various types, such as a vertical field type, a horizontal field type or the like.

The embodiment of the disclosed technology also provides a liquid crystal display, comprising a liquid crystal panel, and the liquid crystal panel comprises a color filter substrate and an array substrate which are boned with each other. The array substrate can be an array substrate according to any embodiment of the disclosed technology. As for the liquid crystal display, the production cost can be decreased by simplifying the manufacturing process, and the defective displaying due to the crack of the pixel electrode may be avoided.

It should be noted that: the above embodiments only have a purpose of illustrating the disclosed technology, but not limiting it. Although the disclosed technology has been described with reference to the above embodiment, those skilled in the art should understand that modifications or alternations can be made to the solution or the technical feature in the described embodiments without departing from the spirit and scope of the disclosed technology.

What is claimed is:

1. A manufacturing method for a thin film transistor, comprising at least a process of forming an active layer, a source electrode and a drain electrode, wherein the process of forming the active layer, the source electrode and the drain electrode comprises:

forming sequentially an active layer film and a source/drain metal film;

applying a layer of photoresist on the source/drain metal film;

exposing and developing the photoresist by using a double-tone mask so as to form a photoresist pattern including a photoresist-completely-remained region, a photoresist-partially-remained region, and a photoresist-completely-removed region;

performing a first wet etch in which the source/drain metal film corresponding to the photoresist-completely-removed region is over-etched so that edges of the source/drain metal film are recessed inside edges of the photoresist pattern;

performing a first dry etch in which the active layer film exposed by the photoresist is etched;

thinning the photoresist by a thickness corresponding to the thickness of the photoresist-partially-remained region through an ashing process, so as to remove the photoresist in the photoresist-partially-remained region, outer edges of the photoresist in the photoresist-completely-remained region being aligned with or close to edges of the source/drain metal film after the ashing process;

performing a second dry etch in which the source/drain metal film corresponding to the photoresist-partially-remained region is etched and the active layer exposed outside the source/drain metal film is simultaneously etched;

performing a third dry etch in which a part of the active layer film corresponding to the photoresist-partially-remained region is etched; and removing the remained photoresist.

2. The manufacturing method for the thin film transistor of claim 1, wherein the over-etching comprises:

over-etching the source/drain metal film so that the edges of the source/drain metal film are recessed inside the edges of the photoresist pattern, and the edges of the source/drain metal film are covered within the photoresist pattern after thinning the photoresist by the thickness corresponding to the thickness of the photoresist-partially-remained region through the ashing process.

3. The manufacturing method for the thin film transistor of claim 1, wherein the third dry etch comprises:

performing the third dry etch so that a doped semiconductor film in the active layer film corresponding to the photoresist-partially-remained region is etched.

4. The manufacturing method for the thin film transistor of claim 1, wherein the etching time for the first wet etch is 130%-300% of the time by which the source/drain metal film corresponding to the photoresist-completely-removed region is removed completely.

5. The manufacturing method for the thin film transistor of claim 1, wherein the etching time for the second dry etch is 110%-300% of the time by which the source/drain metal film corresponding to the photoresist-partially-remained region is etched away, so as to simultaneously etch the active layer film exposed outside the source/drain metal film.

6. A manufacturing method for an array substrate, wherein the array substrate comprises a base substrate and a thin film transistor formed on the base substrate, and the thin film transistor is formed by the manufacturing method for the thin film transistor of claim 1.

7. The manufacturing method for the array substrate of claim 6, wherein the array substrate further comprises a gate line, a data line, a pixel electrode and a common electrode, and the thin film transistor comprises a gate electrode, the active layer, the source electrode and the drain electrode,
   wherein the process for forming the gate line, the gate electrode, the data line, the active layer, the source electrode, the drain electrode, the pixel electrode and the common electrode comprises:
   Step 1, forming the gate line and the gate electrode on the base substrate by a patterning process;
   Step 2, forming a gate insulating layer on the base substrate after Step 1;
   Step 3, forming the active layer, the source electrode, and the drain electrode on the gate insulating layer with the process of forming the active layer, the source electrode and the drain electrode, and forming the data line simultaneously with the source electrode and the drain electrode;
   Step 4, forming the pixel electrode on the base substrate after Step 3 by a patterning process, the pixel electrode being lap-jointed on the drain electrode;
   Step 5, forming a passivation layer on the base substrate after Step 4; and
   Step 6, forming the common electrode on the passivation layer through a patterning process.

8. The manufacturing method for the array substrate of claim 6, wherein the over-etching comprises:
   over-etching the source/drain metal film so that edges of the source/drain metal film are recessed inside edges of the photoresist pattern, and the edges of the source/drain metal film is covered within the photoresist pattern after thinning the photoresist by a thickness corresponding to the thickness of the photoresist-partially-remained region through an ashing process.

9. The manufacturing method for the array substrate of claim 6, wherein the third dry etch comprises:
   performing the third dry etch so that a doped semiconductor film in the active layer film corresponding to the photoresist-partially-remained region is etched.

10. The manufacturing method for the array substrate of claim 6, wherein the etching time for first wet etch is 130%-300% of the time by which the source/drain metal film corresponding to the photoresist-completely-removed region is removed completely.

11. The manufacturing method for the array substrate of claim 6, wherein the etching time for the second dry etch is 110%-300% of the time by which the source/drain metal film corresponding to the photoresist-partially-remained region is etched away, so as to simultaneously etching the active layer film exposed outside the source/drain metal film.

* * * * *